US006918351B2

United States Patent
Chen et al.

(10) Patent No.: US 6,918,351 B2
(45) Date of Patent: Jul. 19, 2005

(54) APPARATUS FOR ION BEAM IMPLANTATION

(75) Inventors: Jiong Chen, San Jose, CA (US); Zhimin Wan, Sunnyvale, CA (US)

(73) Assignee: Advanced Ion Beam Technology, Inc., Sunnyvale, CA (US)

( * ) Notice: Subject to any disclaimer, the term of this patent is extended or adjusted under 35 U.S.C. 154(b) by 149 days.

(21) Appl. No.: 10/133,140

(22) Filed: Apr. 26, 2002

(65) Prior Publication Data

US 2003/0200930 A1 Oct. 30, 2003

(51) Int. Cl.[7] .................. C23C 16/00; H01G 37/317
(52) U.S. Cl. .............. 118/723 CB; 118/723 EB; 118/723 FE; 250/492.21; 250/492.23
(58) Field of Search ............... 118/723 CB, 723 EB, 118/723 FE, 723 FI, 712; 250/492.21, 492.23, 492.3

(56) References Cited

U.S. PATENT DOCUMENTS 4,700,077 A * 10/1987 Dykstra et al. .......... 250/492.2
6,207,963 B1 * 3/2001 Benveniste ............ 250/492.21
2002/0056814 A1 * 5/2002 Sakai et al. ............. 250/491.1

\* cited by examiner

Primary Examiner—Parviz Hassanzadeh
(74) Attorney, Agent, or Firm—Bo-In Lin

(57) ABSTRACT

This invention discloses an ion implantation apparatus that has an ion source and an ion extraction device for extracting an ion beam therefrom. The ion implantation apparatus includes an ion beam sweeping-and-deflecting device disposed immediately next to the ion extraction device. The ion implantation apparatus further includes a magnetic analyzer for guiding the ion beam passed through the deflecting-and-sweeping device. The mass analyzer is also used for selecting ions with specific mass-to-charge ratio to pass through a mass slit to project onto a substrate. The sweeping-and-deflecting device is applied to deflect the ion beam to project through the magnetic mass analyzer and the mass slit for sweeping the ion beam over a surface of the substrate to carry out an ion implantation.

32 Claims, 3 Drawing Sheets

APPARATUS FOR ION BEAM IMPLANTATION

BACKGROUND OF THE INVENTION

1. Field of the Invention

The invention disclosed herein relates generally to apparatus for performing ion implantation employed in the manufacturing process of semiconductor and optical communication devices. Specifically, this invention relates to an improved implantation apparatus and methods for performing a high/medium current and low energy ion implantation.

2. Description of the Prior Art

Ion implantation is a ballistic process used to introduce atoms or molecules, generally referred to as dopants, to make materials with useful properties. In particular, ion implantation is a common process used in making modern integrated circuits. Ion implantation process may also be applied for thin film deposition with controlled thickness and predefined surface properties employed for manufacturing optical or display devices. However, the semiconductor equipment suppliers are now faced with a difficult challenge to make a simple serial implantation machine capable of achieving wider range of implanting current adjustment that would be reliable with competitive process control capability. Particularly, for serial mode implantation, it is difficult to generate a high current ion beam with sufficient uniform density-distribution and that the ion beam can be controlled with desirable shapes and size. Especially, under the circumstances when the ion beam has to be expanded to cover a wafer surface, the beam uniformity is degraded and the quality of implantation suffers because of this difficulty.

Varian Semiconductor Equipment Associates of Gloucester, Mass. have manufactured Model SHC80 implantation systems. In order to expand the beam to carry out implantation process, the beam is expanded along the dispersive plane using magnetic fields in closed loop control to maintain the uniformity of the beam. Due to the complex interactions between the ion beam and the magnetic field applied for beam expansion, this external asserted magnetic field for beam expansion would generate severe technical, practical, and process related problems associated with this existing approach. Furthermore, the design and manufacturing processes for providing the beam expansion magnetic field often increase the total production cost of such equipment and lead to more complicate operation procedures for carrying out the ion implantation.

For all of the above reasons, conventional techniques of ion beam expansion as described above do not provide a viable solution to enable a person of ordinary skill in the art to carry out a serial mode implantation with a high-current high-uniformity ion beam that has controllable shapes and sizes. There is a need in the art of IC device fabrication to provide new system configuration for generating high current ion beam that has improved uniformity without requiring additional components for reducing the production cost and simplify the manufacturing processes.

Additional challenge that is still faced by those of ordinary skill in the art in performing an ion implantation is to control the implanting ions to project in a parallel trajectory perpendicular to the substrate surface and in the meantime providing a high implanting current. The challenge arises from a special configuration commonly implemented in the conventional implantation apparatuses that employs a "paralleling control" mechanism, often referred to as a "collimator magnet", that is required to collimate and guide the implanting ions into parallel paths. This collimator magnet is placed near the substrate. This collimator magnet interferes with and collimate the ion thus occupies a definite space between the mass select slit and the substrate. This conventional configuration becomes a hindrance because the magnet collimator occupies the space thus adds to the complication of placing a plasma electron shower near the substrate for the purpose for obtaining a higher beam current.

The difficulties of being not able to achieve a higher implanting beam currents as discussed above impose a sever limitation to the development of integrated circuit technology. Specifically, a technology road map presented by Saito in IIT'98 [International Conference on Ion Implantation Technology, Kyoto, Japan, 1998] indicates that sub-keV implantation energy is required for the 0.15 $\mu$m and below technology nodes. For example, 0.5 keV boron ions are used for 0.13 $\mu$m devices and 0.2 keV for 0.1 $\mu$m devices. Conventional implantation systems are unable to provide production worthy beam currents at energies below 2 keV because of space-charge beam blow up (i.e. divergence) associated with low energy beams. For this reason, in order to obtain a high beam current, a plasma electron shower is required to prevent an occurrence of a beam divergence by purging the undesirable effects of space charge.

Referring to FIG. 1 for an ion implantation apparatus according to a conventional configuration. The implanting apparatus comprises an ion beam source 10 with an extraction assembly 11, directing an ion beam 12 through an ion mass selector 13 to impinge on a target substrate 14 mounted on a target substrate holder 15. These elements described above of the ion implantation apparatuses are housed in a vacuum housing of which a part 15 only is illustrated in the Figure. The vacuum housing may be evacuated by a vacuum pump 16. The ion source 10 may comprise any known ion source such as a Freeman source or a Bernas source. The ion source 10 comprises an arc chamber that is fed with a supply of atoms of or molecules containing the element, ions to be implanted into the target substrate 14. The molecules may be supplied to the arc chamber in gaseous or vapor form, e.g. from a gas bottle 17. The extraction assembly 11 comprises a number of electrodes located immediately outside a front face of the arc chamber of the ion source 10 so as to extract ions from the arc chamber through an exit aperture in the front face. The effect of steering the beam 50 extracted from the ion source for directing along the centerline of the extraction assembly 11 and into the center of the entrance aperture of the ion mass selector 13. The ion mass selector 13 includes a magnetic sector mass analyzer 53, operating in conjunction with a mass selecting slit 54. The magnetic analyzer 53 comprises a region of uniform magnetic field in the direction perpendicular to the plane of the paper. In such a magnetic field, all ions of constant energy and having the same mass-to-charge ratio pass through circular paths of uniform radius. The radius of curvature of the path is dependent on the mass-to-charge ratio of the ions, assuming uniform energy. As that shown in FIG. 1, the ion beam 50 generated from the ion source 10 is mass analyzed by a magnetic analyzer 53 and travels along a curved trajectory that makes a nearly ninety-degree turn.

The beam 50 is for ions of a narrow range of mass/charge ratios and the beam comes almost to a single focus at the aperture of the slit 54. The beam of ions of a specific mass/charge ratio can pass through the slit 54 towards the target substrate 14. In practice, the beam emitted by the ion source 10 will also contain ions of different mass/charge ratio from those desired for implantation in the substrate 14.

The undesired ions will be brought to a focus by the analyzer 53 at a point in the plane of the slit 54 either side of the position of the slit, and will therefore be prevented from traveling on towards the substrate. The ion beam 50 is then passed through a magnetic collimator 60 which has the effect of paralleling the scanned beam, so that the angle of the implanting ions from the beam into the substrate 14 on the substrate holder 15 is constant over the range of scanning.

As discussed above, the use of the magnetic collimator makes it difficult to employ a plasma electron flood system between the slit 54 and the substrate 14. Therefore, a need still exists in the art to provide an improved configuration to resolve this difficult in order an ion beam of high beam current can be provided for performing the ion implantation process.

SUMMARY OF THE PRESENT INVENTION

It is the object of the present invention to provide a new ion implant apparatus and method for controlling the path of the ion beam to allow for space for placing a plasma electron flood system near the substrate. The plasma electron shower system may be applied to prevent beam divergence due to space charge in order to provide a higher beam current to overcome the limitations faced by the prior art implantation systems.

Another object of the present invention is to provide a new ion implant system for improved beam coverage and beam control for use in serial ion implantation and that the beam has relatively a highly uniform density-distribution over the entire height of the wafer. The new ion implant system has novel beam expansion system to overcome the problems encountered in the prior art.

Another object of the invention is to present a new ion implantation system. In this new implantation system, a new beam-optics is employed to provide an ion beam with a relatively uniform density and a height that is at least as tall as a target wafer that is about 200 to 300 mm. The width of the beam is controlled to be sufficiently narrow so as to preserve the mass-resolution integrity of the system.

Another object of the present invention is to provide a new ion implantation system that employs a novel ion beam-optics to generate a narrow and tall ion beam. With this novel beam optics, it is not required to produce an excessively tall ion beam at the source. Instead, the beam-optics expands the beam in the non-dispersive plane of the analysis magnet to generate a narrow and tall ion beam suitable for serial mode implantation.

Another object of the present invention is to provide a new ion implantation system that employs a novel ion beam-optics to generate a narrow and tall ion beam without requiring a tall and narrow beam directly provided by the ion source. The technical difficulties and the problems of reliability and stability often encountered in producing and transporting a very tall ion beam from the ion source and then guiding the very tall and narrow beam to the target wafer are therefore resolved by this invention.

Specifically, this invention discloses a new and improved ion implant apparatus and method of controlling the path of the ion beam by employing a deflecting-and-sweeping means right after the ion beam is extracted from the ion source. The ion beam is controlled to sweep with a longer radius with smaller sweeping angle by applying the sweeping and deflecting means. The requirement for using a magnet collimator to collimate the ions into parallel beam is no longer necessary. Furthermore, with longer sweeping radius to sweep over smaller angle, a more uniform intensity of implantation can be achieved because the ion beam has a smaller incline angle from a perpendicular direction to the substrate. Meanwhile, with a longer sweeping radius, it is more convenient to improve the implanting uniformity by using a substrate having a cylindrical curvature surface. A substrate with a cylindrical surface with smaller curvature may be used with long sweeping radius. More uniform implantation may be achieved to provide improved integrated circuits with higher production yield and higher quality.

Briefly, this invention discloses an ion implantation apparatus that has an ion source and an ion extraction means for extracting an ion beam. The ion implantation apparatus further includes an ion beam sweeping-and-deflecting means disposed immediately next to the ion extraction means. The ion implantation apparatus further includes a magnetic analyzer for guiding the ion beam passed through the deflecting-and-sweeping means. The mass analyzer is also used for selecting ions with specific mass-to-charge ratio to pass through a mass slit to project onto a substrate. The sweeping-and-deflecting means is applied to deflect the ion beam to project through the magnetic mass analyzer and the mass slit for sweeping the ion beam over a surface of the substrate to carry out an ion implantation. In a preferred embodiment, the ion implantation apparatus further includes a plasma electron flood system disposed between the mass slit and the substrate for projecting a plurality of electrons to the ion beam for preventing a space-charge and beam dispersion.

In another preferred embodiment, the present invention discloses an ion implantation apparatus. The ion implantation apparatus includes an ion source for extracting an ion beam through a divergent extraction-optics to on a non-dispersive plane to travel through a beam density controller and a mass analysis magnet. The implantation apparatus further includes a target chamber for containing a target wafer for implantation. The ion beam is shaped by the divergent extraction optics and the beam density controller to become a relatively tall and narrow beam with respect to the non-dispersive pane of the magnet. The extracting-optics has a convex geometry to produce divergent beam upon exiting the extracting-optics. As the beam continues to travel, the beam continues to become taller as the ion beam continues to diverge such that when the ion beams reaches the target wafer, it has sufficient height to cover the entire diameter of the wafer. The apparatus for ion implantation further includes a faraday beam current measurement device disposed in proximity to the target wafer for scanning across the ion beam to measure the beam uniformity and to provide the measurement data back to the beam density controller.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

The present invention teaches a new ion implantation system and an improved method for controlling the path of the ion beam for sweeping and implanting a substrate. The novel method of ion implantation can be applied to obtain high current without being limited by the need of employing a magnet collimator to control the parallel ion projections. The novel configuration and method of implantation further improve the implant uniformity.

Figure 1:
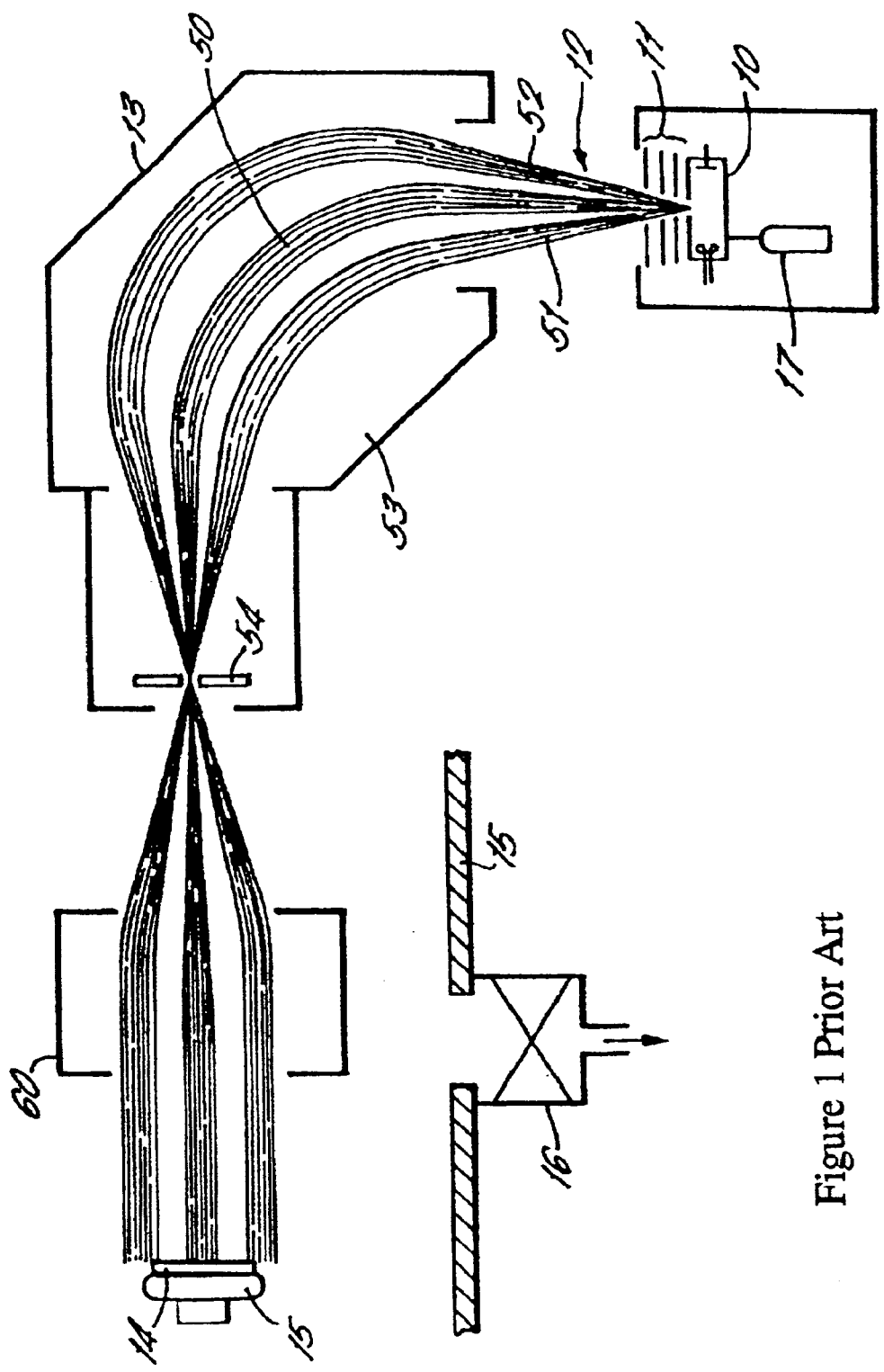
FIG. 1 is a functional block diagram of a conventional ion implantation system.
Figure 2A:
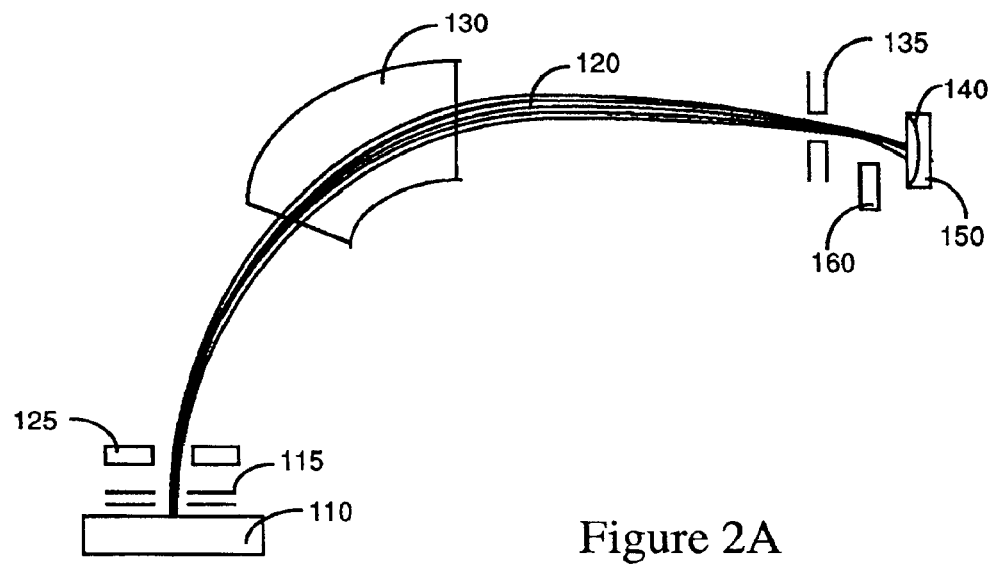
FIG. 2A is a top view for showing a new implantation system of this invention with specially configured ion-beam deflecting-and-sweeping means disposed right outside of an ion source.

Referring to FIG. 2A for a top view of an ion implantation apparatus 100 according to the present invention. The implanting apparatus includes an ion beam source 110 with an extraction assembly 115, directing an ion beam 120 to project through a magnetic deflector 125. The ion beam 120 than travels through a mass analyzer, e.g., an ion mass selector 130 to impinge on a target substrate 140 mounted on a substrate holder 150. The ion beam source 110 of the implantation apparatus is housed in a vacuum chamber that can be evacuated by a vacuum pump. The vacuum chamber and the vacuum pump are understood and not shown for the purpose of simplicity in describing the main theme of this invention. The magnetic deflector 125 has a magnetic field B that has a direction parallel to the magnetic filed of the mass analyzer 130. The ion beam 120 is then projected through a mass selecting slit 135 to arrive at the surface of the substrate 140. The effect of placing the magnetic deflector 125 outside of the ion source 110 immediately next to the ion extraction assembly is to increase the sweeping radius of the ion beam across the surface of the substrate 140 as that shown in the cross sectional view 2B. The implanting ions are controlled by the magnetic deflector 125 to sweep over a sweeping angle θ. Compared to the prior art implantation system, the sweeping angle θ is much smaller than the sweeping angle as that shown in FIG. 1. The ion beam is now projected to the surface of the substrate with very small incline angle from a direction perpendicular to the substrate. More uniform implantation density can now be achieved with a longer sweeping ion beam radius and smaller sweeping angle.

The surface of the substrate 140 is placed on a cylindrical-shaped holder with a small curvature such that the substrate surface is perpendicular to the sweeping ion beam 120 as will be further explained below in FIG. 2B. A plasma electron shower 160 is now placed between the mass selecting slit 135 and the substrate 140 and near the substrate for the purpose for obtaining a higher beam current. Because the beam collimator is no longer required, it is more convenient to place the electron shower 160 next to the substrate.

Figure 2B:
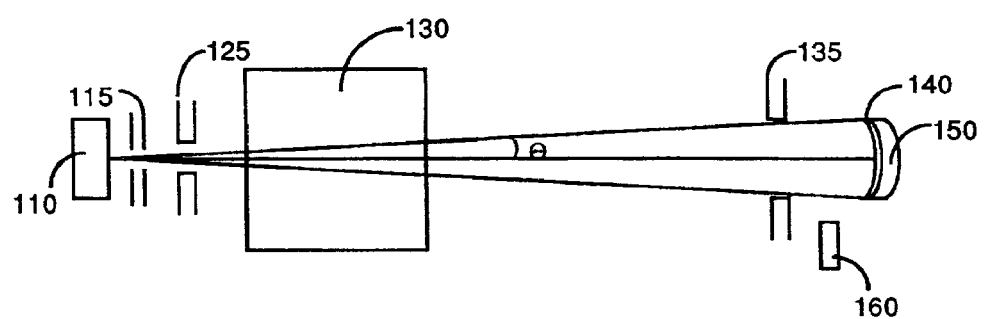
FIG. 2B is a side cross sectional view for showing the implantation system of FIG. 2A with improved ion beam extraction optics for generating a small divergent angle along a non-dispersive plane as that described in FIG. 3.

Referring to FIG. 2B for a side cross sectional view of the ion implantation apparatus 100 as that shown in FIG. 2A. The magnetic deflector 125 as shown is placed immediately outside of the ion beam source chamber 110. The magnetic deflector 125 controls the ion beam to sweep over a small angle θ to vertically cover the entire diameter of the target wafer 140 held on a cylindrically shaped holder 150. The substrate 140 is pressed onto the holder 150 and slightly bent to have a curvature such that the sweeping beam 125 is projected perpendicularly onto the surface of the target wafer 140 when the ion beam 125 sweeps over the wafer 140. More uniform implantation can be achieved. With a longer sweeping radius and small sweeping angle θ as that shown in FIG. 2B, the surface curvature of the substrate 140 can be relative small when compared to a substrate with curvature required for that of prior art implantation apparatuses.

Therefore, the present invention provides a new ion implant apparatus and method for controlling the path of the ion beam to allow for space for placing a plasma electron flood system near the substrate. The plasma electron shower system may be applied to prevent beam divergence due to space charge in order to provide a higher beam current to overcome the limitations faced by the prior art implantation systems. Specifically, a new and improved ion implant apparatus is disclosed by employing a deflecting-and-sweeping means right after the ion beam is extracted from the ion source. The ion beam is controlled to sweep with a larger radius with smaller sweeping angle by applying the sweeping and deflecting means. The requirement for using a magnet collimator to collimate the ions into parallel beam is no longer necessary. Furthermore, with longer sweeping radius to sweep over smaller angle, a more uniform intensity of implantation can be achieved because the ion beam has a smaller incline angle from a perpendicular direction to the substrate. Meanwhile, with a longer sweeping radius, it is more convenient to improve the implanting uniformity by using a substrate having a cylindrical curvature surface. A substrate with a cylindrical surface with smaller curvature may be used with large sweeping radius. More uniform implantation may be achieved to provide improved integrated circuits with higher production yield and higher quality.

Figure 3:
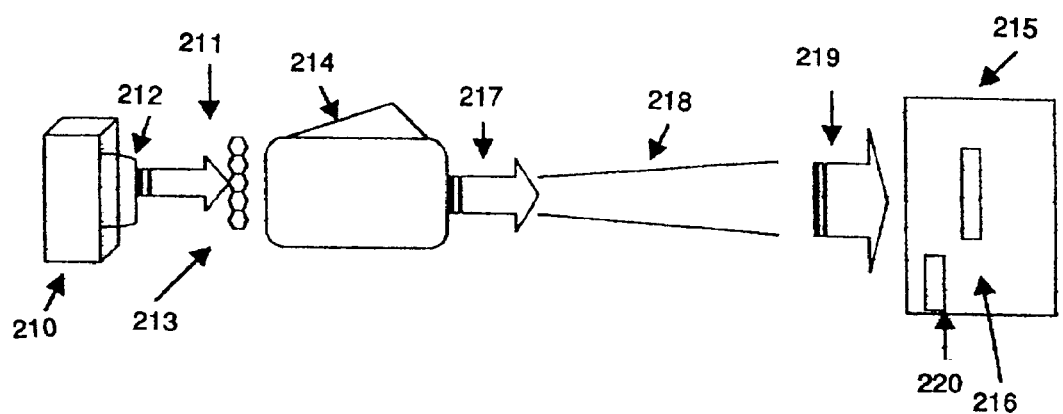
FIG. 3 is a functional block diagram of a new and improved ion implantation system of this invention.

Referring to FIG. 3 for an ion implant system of the present invention that comprises an ion source 210. The ion source 210 produces an ion beam 211 that emanates from its divergent extraction optics 212, a beam current density controller 213, and a mass analysis magnet 214. It may further comprise a target chamber 215 for containing a target 216 for implantation. The ion beam is relatively tall and thin with respect to the non-dispersive plane of the magnet. The extraction optics has a convex geometry such that the extracted beam 211 is slightly divergent upon exiting the extraction electrode assembly 212. As the beam travels along the beam path it continues to become taller 217, 218, 219 as the beam rays continue to diverge such that when it reaches the target wafer its height is larger than the target wafer's diameter, i.e. 200 or 300 mm. A Faraday beam current measurement device 220 is located in proximity to the target and can be scanned across the beam to measure the beam uniformity.

The present invention teaches a novel implantation system. In a preferred embodiment, a Bernas-type ion source 210 is used to produce an ion beam, which is much taller than it is wide 211. A set of extraction optics 212 with a slightly concave shape is used to extract the ion beam by applying a relative negative potential on the first electrode. The emergent beam had slightly divergent ray paths with respect to the non-dispersive plane of the magnet system 214. The ion beam then traverses a beam density controller 213 that is controlled in either open or closed loop operation via feedback from a faraday beam profile measurement system 220 located in the target chamber 215. The beam density controller 213 changes the beam current density of the beam to insure that the amount of total ion beam current per unit height is uniform at the point of use, i.e. the target wafer 216. After the ion beam passes through the beam density controller 213 it is directed into a mass analysis magnet 214 that is used to select the desired ions with the appropriate charge to mass ratio. The filtered ion beam 217 is then continues along the beam line and expands 218 due to its self-potential to a desired size 219 as it is directed onto a work piece 216 contained within the target chamber 215. The target 216 can be mechanically scanned in a different plane so as to provide uniform convergence of the target. In this invention, the fact that the target wafer can tolerate a slightly non-parallel beam incident across its entire surface is exploited. The slightly non-parallel beam is acceptable provided that the angular variation is less than ±2° as demonstrated in modern batch-mode machines. Furthermore, the wafer holder is bent slightly to have a cylindrical shape. The target wafer when placed on the wafer holder is also bent to have a small curvature such that the entire surface of the target wafer is perpendicular to the divergent ion beam to achieve higher implantation uniformity across the entire surface.

The ion implantation system of this invention has significant advantages over the ion implantation of the prior art used in implantation. Serial-mode implantation is preferable to batch-mode for throughput considerations and reduced risk in product loss in the event of machine failure. Serial ion implantation systems also have much simpler and less expensive wafer handling systems so that development, manufacturing, and operating costs are lower than batch-mode systems. By implementing the system design and configuration of this invention, the semiconductor equipment suppliers is enabled to meet the challenges to make a serial machine for implantation applications that was reliable and had competitive process control capability. The difficulties and limitations of the prior art are resolved by this invention. Furthermore, the novel system configuration as now taught by this invention involves relatively few components compared to other serial high current methods, which have yet to achieve any notable success. Currently batch mode machines are filling the high current implanter niche but this invention will provide a superior product to the semiconductor industry, especially for low energy and 300 mm applications.

In comparison to the prior art implantation systems, this invention is novel in that it discloses an apparatus that expands an ion beam in the non-dispersive plane. With this special feature, the resulting beam is uniform and its height is larger than the implantation target so that mechanical scanning of the wafer in one dimension is sufficient to obtain complete coverage of the wafer. Other than the facts that the target wafer can tolerate a non-parallel cross wafer variation, ~±2°, in the incident ion beam angle as demonstrated by modern batch-mode machines, further improvement is made by implementing a wafer with cylindrical curvature to compensate for the non-parallel beam angle variations. The beam is initially extracted from the ion source with a slightly divergent beam with respect to the non-dispersive plane of the magnet system. A novel element of the beam line is the use of a mechanical beam uniformity controller that modifies and controls the beam density. The beam density controller intercepts the beam at the appropriate locations along the length of the beam such that it changes the amount of beam current per unit beam height at a given position along the beam height axis. Another novel feature is the beam expansion due to the initial ray path directions as it traverses along the beam line such that the beam height becomes taller than the diameter of the target wafer. The expansion is sufficiently gradual (i.e. small angle) such that the variation in the incident angle across the wafer is not greater than ~±2°. With the bending curvature of the substrate now disclosed in this invention, the angle-variations of the incident beam due to the non-parallel projection trajectories are now corrected. The target wafer can then be mechanically scanned along an axis either along that of the beam width or along different axis with a predefined implant angle can be carried out to achieve the desired doping level.

In essence, this invention teaches an ion implantation apparatus that includes an ion source. The implantation apparatus further includes a divergent extraction-optics for extracting an ion beam from the ion source to project with a slightly divergent angle relative to an ion-beam axis. In a preferred embodiment, the ion implantation apparatus further includes a beam density controller disposed immediately next to the divergent extraction optics for controlling a beam density of the ion beam. And, the apparatus further includes a mass analysis magnet disposed immediately next to the beam density controller for shaping and guiding the ion beam. In a preferred embodiment, the ion implantation apparatus further includes a target chamber for containing a target wafer for implantation. In a preferred embodiment, the ion beam is shaped by the divergent extraction optics and the beam density controller to become a relatively tall and narrow beam with respect to a non-dispersive plane of the mass analysis magnet. In another preferred embodiment, the extracting-optics having a concave geometry to produce a divergent ion beam upon exiting the divergent extracting-optics. In a preferred embodiment, the ion beam continues to become taller as the ion beam continues to diverge in transmitting to an implantation target. As that shown in FIG. 3B, the extracted ion beam is slightly divergent such that the beam is thin and tall when it reaches the substrate and cover the enter height of the substrate such that when it sweep across the width of the substrate, the ion beam is uniformly sweeping across the enter surface of the target wafer.

In contrast to the prior art techniques, the disclosures of this invention enable the ion beam to sweep in a direction perpendicular to or along a different direction from the projection direction of the ion beam and in an alternate embodiment to expand in a non-dispersive plane. In addition to ion implantation, the ion-beam extracting and projecting system as shown can also be employed for depositing ion particles for thin film coating or carrying out other types of surface processing applications. As the radius of sweeping is lengthened, the sweeping angle can be reduced to achieve higher uniformity. Furthermore, in the second embodiment, as the beam is projected as a divergent bean with small divergent angle, highly uniform beam density is provided for implantation or depositing particle to achieve higher level of uniformity as the expanded beam reaches the target surface. Furthermore, with longer sweeping radius of an ion beam as that shown in FIGS. 2A and 2B, the apparatus disclosed in this invention is suitable for large panel area deposition on a surface to form optical filtering coatings or for different types of surface processing functions on glass, metals or wide variety of materials.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. An ion implantation apparatus comprising an ion source and an ion extraction means for extracting an ion beam therefrom and a mass magnetic analyzer for guiding said ion beam to project along a trajectory according to a mass-to-charge ratio, further comprising:

an ion beam sweeping-and-deflecting means disposed immediately next to said ion extraction means having a magnetic field substantially parallel to a magnetic filed of said magnetic analyzer for deflecting said ion beam for enabling a beam-sweeping function started from immediately next to said extraction means.

2. The ion implantation apparatus of claim 1 wherein:
said ion beam is projected substantially along a forward projecting direction wherein said magnetic analyzer collimating said ion beam whereby a separate magnetic collimating device is not required.

3. The ion implantation apparatus of claim 1 wherein:
said sweeping-and-deflecting means is applied to deflect said ion beam to project through said magnetic mass analyzer and a mass slit for sweeping said ion beam over a surface of a substrate to carry out an ion implantation.

4. The ion implantation apparatus of claim 1 further comprising:
a plasma electron flood system disposed between a mass slit and a target substrate of implantation for projecting a plurality of electrons to said ion beam for preventing a space-charge and beam dispersion.

5. The ion implantation apparatus of claim 1 wherein:
said ion extraction means including a divergent extraction-optics for extracting said ion beam from said ion source to project with a slightly divergent angle relative to a forward projecting direction of said ion-beam.

6. The ion implantation apparatus of claim 5 further comprising:
a beam density controller disposed immediately next to said divergent extraction optics for controlling a beam density of said ion beam.

7. The ion implantation apparatus of claim 5 wherein:
said ion beam is shaped by said divergent extraction optics and a beam density controller to become a relatively tall and narrow beam with respect to a non-dispersive plane of said mass magnet analyzer.

8. The ion implantation apparatus of claim 5 wherein:
said extracting-optics having a concave shape to produce a divergent ion beam upon exiting said divergent extracting-optics.

9. The ion implantation apparatus of claim 5 wherein:
said ion beam continues to become taller as said ion beam continues to diverge with respect to a non-dispersive plane in transmitting to an implantation target.

10. The ion implantation apparatus of claim 9 wherein:
said ion beam is divergently projected for having a sufficient height to cover an entire diameter of said implantation target.

11. The ion implantation apparatus of claim 10 further comprising:
a Faraday beam current measurement device disposed in proximity to said implantation target for scanning across said ion beam to measure a beam uniformity and to provide measurement data back to said beam density controller.

12. The ion implantation apparatus of claim 1 further comprising:
a target chamber for containing a target wafer disposed along a projection path of said ion beam at a distance away from said magnetic analyzer opposite said ion source for exposing to said ion beam for implantation.

13. The ion implantation apparatus of claim 1 further comprising:
a target wafer holder having a holding surface with a surface curvature for holding a target wafer thereon.

14. An ion implantation apparatus comprising an ion source and an ion extraction means for extracting an ion beam therefrom and a mass magnetic analyzer for guiding said ion beam to project along a trajectory according to a mass-to-charge ratio further comprising:
an ion beam sweeping-and-deflecting means disposed immediately next to said ion extraction means having a magnetic field substantially parallel to a magnetic filed of said magnetic analyzer for deflecting said ion beam for enabling a beam-sweeping function started from immediately next to said extraction means; and
a divergent extraction-optics for extracting an ion beam from said ion source to project with a slightly divergent angle relative to an ion-beam axis.

15. The ion implantation apparatus of claim 14 further comprising:
a beam density controller disposed immediately next to said divergent extraction optics for controlling a beam density of said ion beam; and
said mass magnet analyzer disposed immediately next to said beam density controller for shaping and guiding said ion beam.

16. The ion implantation apparatus of claim 15 wherein:
said ion beam is shaped by said divergent extraction optics and said beam density controller to become a relatively tall and narrow beam with respect to a non-dispersive plane of said mass magnet analyzer.

17. The ion implantation apparatus of claim 14 further comprising:
a target chamber for containing a target wafer disposed along a projection path of said ion beam at a distance away from said magnetic analyzer opposite said ion source for exposing to said ion beam for implantation.

18. The ion implantation apparatus of claim 17 wherein:
said ion beam is divergently projected for having a sufficient height to cover an entire diameter of said implantation target.

19. The ion implantation apparatus of claim 17 further comprising:
a Faraday beam current measurement device disposed in proximity to said implantation target for scanning across said ion beam to measure a beam uniformity and to provide measurement data back to said beam density controller.

20. The ion implantation apparatus of claim 14 wherein:
said extracting-optics having a concave shape to produce a divergent ion beam upon exiting said divergent extracting-optics.

21. The ion implantation apparatus of claim 14 wherein:
said ion beam continues to become taller as said ion beam continues to diverge with respect to a non-dispersive plane in transmitting to an implantation target.

22. The ion implantation apparatus of claim 14 further comprising:
a target wafer holder having a holding surface with a surface curvature for holding a target wafer thereon.

23. An ion-particle deposition apparatus for depositing a thin-film coating with ion particles on a depositing target comprising an ion source and an ion extraction means for extracting an ion beam therefrom and a mass magnetic analyzer for guiding said ion beam to project along a trajectory according to a mass-to-charge ratio, further comprising:
an ion beam sweeping-and-deflecting means disposed immediately next to said ion extraction means having a magnetic field substantially parallel to a magnetic filed of said magnetic analyzer for deflecting said ion beam for enabling a beam-sweeping function started from immediately next to said extraction means.

24. The ion-particle deposition apparatus of claim 23 further comprising:
said ion beam is projected substantially along a forward projecting direction wherein said magnetic analyzer collimating said ion beam whereby a separate magnetic collimating device is not required.

25. The ion-particle deposition apparatus of claim 23 wherein:
said sweeping-and-deflecting means is applied to deflect said ion beam to project through said magnetic mass analyzer and a mass slit for sweeping said ion beam over a surface of said depositing target to carry out an ion-particle deposition.

26. An ion-particle deposition apparatus for depositing a thin-film coating with ion particles on a depositing target comprising an ion source and an ion extraction means for extracting an ion beam therefrom and a mass magnetic analyzer for guiding said ion beam to project along a trajectory according to a mass-to-charge ratio, further comprising:
an ion beam sweeping-and-deflecting means disposed immediately next to said ion extraction means having a magnetic field substantially parallel to a magnetic filed of said magnetic analyzer for deflecting said ion beam for enabling a beam-sweeping function started from immediately next to said extraction means; and
a divergent extraction-optics for extracting an ion beam from said ion source to project with a slightly divergent angle relative to an ion-beam axis.

27. The ion-particle deposition apparatus of claim 26 further comprising:
a beam density controller disposed immediately next to said divergent extraction optics for controlling a beam density of said ion beam; and
said mass magnet analyzer disposed immediately next to said beam density controller for shaping and guiding said ion beam.

28. A panel-area ion-particle deposition apparatus comprising an ion source and an ion extraction means for extracting an ion beam therefrom and a mass magnetic analyzer for guiding said ion beam to project along a trajectory according to a mass-to-charge ratio, further comprising:
an ion beam sweeping-and-deflecting means disposed immediately next to said ion extraction means having a magnetic field substantially parallel to a magnetic filed of said magnetic analyzer for deflecting said ion beam for enabling a beam-sweeping function over an extended panel-area started from immediately next to said extraction means.

29. The panel-area ion-particle deposition apparatus of claim 28 further comprising:
said ion beam is projected substantially along a forward projecting direction wherein said magnetic analyzer collimating said ion beam whereby a separate magnetic collimating device is not required.

30. A panel-area ion-particle deposition apparatus comprising an ion source and an ion extraction means for extracting an ion beam therefrom and a mass magnetic analyzer for guiding said ion beam to project along a trajectory according to a mass-to-charge ratio, further comprising:
an ion beam sweeping-and-deflecting means disposed immediately next to said ion extraction means having a magnetic field substantially parallel to a magnetic filed of said magnetic analyzer for deflecting said ion beam for enabling a beam-sweeping function started from immediately next to said extraction means; and
a divergent extraction-optics for extracting an ion beam from said ion source to project with a slightly divergent angle relative to an ion-beam axis to project as a divergent ion-beam onto an extended panel area.

31. The panel-area ion-particle deposition apparatus of claim 30 further comprising:
a beam density controller disposed immediately next to said divergent extraction optics for controlling a beam density of said ion beam; and
said mass magnet analyzer disposed immediately next to said beam density controller for shaping and guiding said ion beam.

32. The panel-area ion-particle deposition apparatus of claim 30 further comprising:
a target panel holder having a holding surface with a surface curvature for holding a target panel thereon.

* * * * *